United States Patent
Iyer et al.

(10) Patent No.: US 8,949,764 B2
(45) Date of Patent: Feb. 3, 2015

(54) EXCLUDING LIBRARY CELLS FOR DELAY OPTIMIZATION IN NUMERICAL SYNTHESIS

(75) Inventors: Mahesh A. Iyer, Fremont, CA (US); Amir H. Mottaez, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/479,807

(22) Filed: May 24, 2012

(65) Prior Publication Data

US 2013/0318488 A1     Nov. 28, 2013

(51) Int. Cl.
    G06F 17/50     (2006.01)
(52) U.S. Cl.
    USPC ............................................ 716/132; 716/134
(58) Field of Classification Search
    USPC .................................................. 716/132–135
    See application file for complete search history.

(56) References Cited

U.S. PATENT DOCUMENTS

| | | | | |
|---|---|---|---|---|
| 6,467,068 | B1 * | 10/2002 | Iyer et al. | 716/102 |
| 6,789,232 | B1 * | 9/2004 | Iyer et al. | 716/103 |
| 8,127,266 | B1 * | 2/2012 | Gupta et al. | 716/139 |
| 2004/0088664 | A1 * | 5/2004 | Srinivasan | 716/6 |
| 2010/0169847 | A1 * | 7/2010 | Gupta et al. | 716/2 |
| 2011/0231811 | A1 * | 9/2011 | Tang et al. | 716/132 |

* cited by examiner

*Primary Examiner* — Binh Tat
(74) *Attorney, Agent, or Firm* — Laxman Sahasrabuddhe (57) ABSTRACT

Methods and systems for excluding library cells are described. Some embodiments receive a generic logical effort value and optionally a generic parasitic delay value for a timing arc of a library cell type. Next, library cells of the library cell type are excluded whose specific logical effort values for the timing arc are greater than the generic logical effort value by more than a first threshold and/or optionally whose specific parasitic delay values for the timing arc are greater than the generic parasitic delay value by more than a second threshold. A new generic logical effort value and optionally a new generic parasitic delay value can be determined based on at least some of the remaining library cells. The process of excluding library cells and determining new generic logical effort values and optionally new generic parasitic delay values can be performed iteratively.

18 Claims, 5 Drawing Sheets

| | IT1 | IT2 | IT3 | | ITm |
|---|---|---|---|---|---|
| OL1 | (OD11,OT11) | (OD12,OT12) | (OD13,OT13) | | (OD1m,OT1m) |
| OL2 | (OD21,OT21) | (OD22,OT22) | (OD23,OT23) | | (OD2m,OT2m) |
| OL3 | (OD31,OT31) | (OD32,OT32) | (OD33,OT33) | | (OD3m,OT3m) |
| ⋮ | | | | | |
| OLn | (ODn1,OTn1) | (ODn2,OTn2) | (ODn3,OTn3) | | (ODnm,OTnm) |

NLDM 304

FIG. 7

US 8,949,764 B2

EXCLUDING LIBRARY CELLS FOR DELAY OPTIMIZATION IN NUMERICAL SYNTHESIS

TECHNICAL FIELD

This disclosure relates to electronic design automation (EDA). More specifically, this disclosure relates to methods and apparatuses for excluding technology library cells (or "library cells" for short) for delay optimization in numerical synthesis.

BACKGROUND

Related Art

The goal of circuit synthesis is to convert a high-level description of a circuit design into an implementation that meets a set of timing constraints, and at the same time optimizes one or more metrics, such as area, leakage power, etc.

Some circuit synthesis approaches create an initial circuit design at a given abstraction level (e.g., a logical or physical design). Next, a cell is identified in the circuit design for optimization based on the metrics that are desired to be optimized. An optimal size for the identified cell is then determined by iteratively replacing the identified cell with functionally equivalent cells that have different sizes (this optimization process is also referred to as "sizing the cell"). For each replacement cell size that is tried, the circuit synthesis approach updates timing information, and rejects cell sizes for which one or more timing constraints are violated. The iterative optimization process typically terminates after the optimization process has executed for a certain number of iterations or for a certain amount of time, or when there are no more timing violations in the design, whichever occurs earlier. Such trial-and-error optimization approaches rely on sizing the gates through trial-and-error to achieve the optimal design.

Unfortunately, these iterative trial-and-error based circuit synthesis approaches either take too long to complete or produce poor quality results especially for large circuit designs in which timing constraints are checked across many process corners and modes.

A different circuit synthesis approach is described in Ivan Sutherland, Robert F. Sproull, and David Harris, *Logical Effort: Designing Fast CMOS Circuits*, Morgan Kaufmann, 1999. This approach uses the following linear cell delay model:

$$d = g \cdot h + p, \quad (1)$$

where, g represents the logical effort, h represents the electrical effort, and p represents the parasitic delay of the cell. The logical effort captures the effect of the cell to produce output current. The logical effort is independent of the size of the transistors in the circuit. The electrical effort describes how the electrical environment of the cell affects performance, and how the size of the transistors in the cell determines its load-driving capability. The parasitic delay is a form of delay overhead that accompanies any gate.

Equation (1) can be rewritten as:

$$d = R \cdot C_o + p, \quad (2)$$

where, R is the output resistance of the cell, $C_o$ is the output loading, and p is the parasitic delay of the cell. Equation (2) can then be rewritten as:

$$d = (R \cdot C_i) \cdot \left(\frac{C_o}{C_i}\right) + p, \quad (3)$$

where, $C_i$ is the input capacitance presented by the cell at one of its input terminals. The first term $(R \cdot C_i)$ represents the logical effort g, and the second term $$\left(\frac{C_o}{C_i}\right)$$

represents the electrical effort h. The logical effort g and the parasitic delay p can be normalized, e.g., they can be normalized with respect to the logical effort and parasitic delay values, respectively, of a reference inverter.

The delay model that is used by a circuit synthesis approach must be accurate, i.e., it must accurately model the actual cell delays. If the delay model is inaccurate, the circuit implementation produced by the circuit synthesis approach will likely contain many timing violations. In the above-mentioned work by Sutherland et al., the authors state that the linear delay model is approximate, and it does not accurately model the actual cell delays. As a result, a circuit synthesis approach that uses the delay model described in the above-mentioned work produces approximate circuit implementations that are likely to have many timing violations.

SUMMARY

Conventional circuit synthesis approaches typically use an iterative trial-and-error based optimization process to optimize a circuit design. These iterative trial-and-error based optimization processes use discretized delay models. A discretized delay model is a delay model in which the delay behavior is represented using a set of discrete data points of delay behavior.

A numerical delay model is different from a discretized delay model. A numerical delay model is a delay model that can be used by a numerical solver to optimize a cost function. Numerical synthesis is a circuit synthesis approach that is different from approaches that are solely based on iterative trial-and-error based optimization. In numerical synthesis, numerical delay models are used to create a numerical optimization problem which, when solved, results in an optimized circuit implementation. The optimality of the resulting circuit implementation is closely related to the accuracy of the numerical delay models used by numerical synthesis.

The numerical delay models used by embodiments described herein are accurate, and can be used by numerical synthesis approaches to produce optimized circuit implementations that have either no timing violations or very few timing violations. Some embodiments described herein provide methods and apparatuses for excluding library cells for delay optimization in numerical synthesis. These methods greatly affect the quality and accuracy of the numerical delay model.

The terms "specific logical effort value" and "specific parasitic delay value" refer to the logical effort value and the parasitic delay value, respectively, either for a particular timing arc of a particular library cell, or for a particular library cell. The "specific logical effort value" and "specific parasitic delay value" for a particular library cell are computed by aggregating the "specific logical effort value" and "specific parasitic delay value" for all timing arcs of the library cell. The terms "generic logical effort value" and "generic parasitic delay value" refer to an aggregated logical effort value and aggregated parasitic delay value, respectively, for an arc of a library cell type or the library cell type itself. In other words, the terms "generic logical effort value" and "generic parasitic delay value" refer to values that are determined by aggregating corresponding specific values across multiple library cells.

Some embodiments receive a generic logical effort value and optionally a generic parasitic delay value for a timing arc of a library cell type. Next, library cells of the library cell type are excluded whose specific logical effort values for the timing arc are greater than the generic logical effort value by more than a first threshold and/or optionally whose specific parasitic delay values for the timing arc are greater than the generic parasitic delay value by more than a second threshold.

A new generic logical effort value and optionally a new generic parasitic delay value can be determined based on at least some of the remaining library cells (i.e., the library cells remaining after the above-described exclusion operation). This process—i.e., excluding library cells based on the current generic logical effort values and optionally the current generic parasitic delay values, and then determining new generic logical effort values and optionally new generic parasitic delay values—can be performed iteratively until a termination condition is met.

In some embodiments, numerical synthesis has at least two phases. In a first phase, numerically optimal sizes for cells in a circuit design are determined. In a second phase, library cells that best match the numerically optimized cell sizes are selected and instantiated in the circuit design. In some embodiments, the subset of the set of library cells (i.e., the library cells that remain after the exclusion operation) is used during the first phase of numerical synthesis, and the entire set of library cells (i.e., the initial set of library cells on which the exclusion operation was performed) is used in the second phase of numerical synthesis.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Figure 1:
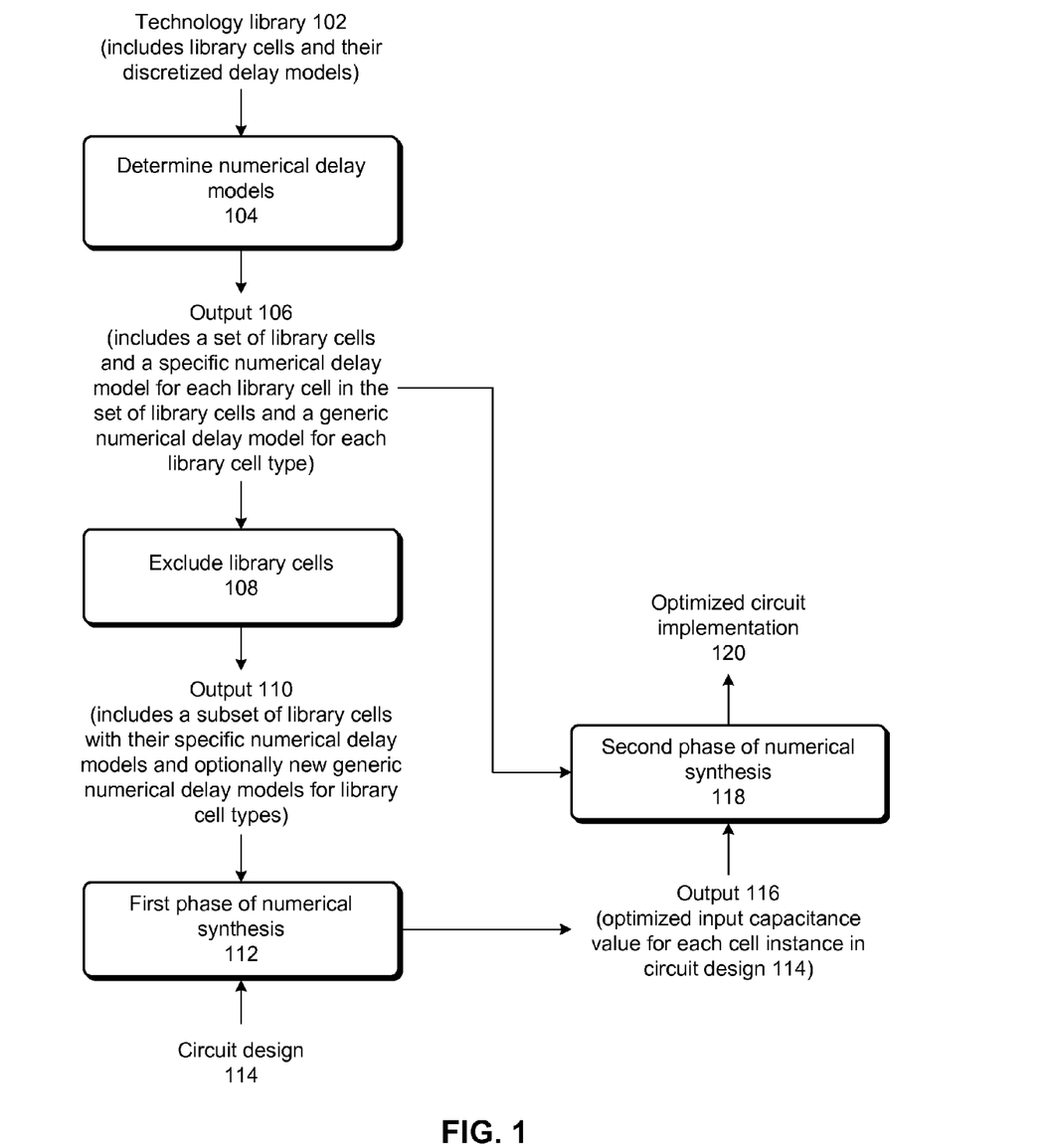
FIG. 1 illustrates a numerical synthesis process in accordance with some embodiments described herein.

FIG. 1 illustrates a numerical synthesis process in accordance with some embodiments described herein.

In some embodiments, technology library 102 includes library cells and discretized delay models for the library cells. The library cells in technology library 102 can be used to create and/or optimize a circuit design. The term "library cell" refers to a cell in a technology library. The term "library cell" is to be distinguished from the term "cell instance" which is an instantiation of a library cell in a circuit design. In some embodiments, a discretized delay model models the delay for a timing arc of a library cell.

The term "library cell type" refers to a particular logical functionality. Examples of functionalities include, but are not limited to, "AND," "OR," "XOR," "multiplexor," etc. The term "library cell" refers to a particular implementation of a library cell type. A technology library can be viewed as a collection of library cells of one or more library cell types. For example, a technology library may include multiple sizes of an inverter. In this example, the term "inverter" is the library cell type, and the term "library cell" refers to an inverter implementation of a particular size.

A numerical delay model is a delay model that can be used by a numerical solver to optimize a cost function. A linear delay model is one example of a numerical delay model. More generally, an analytical formula that represents the delay behavior is an example of a numerical delay model. The term "specific numerical delay model" refers to a numerical delay model that models the delay behavior of a particular timing arc of a particular library cell, or the delay behavior of a particular library cell. The term "generic numerical delay model" refers to a numerical delay model that models an aggregated delay behavior of either a timing arc of a library cell type or the library cell type itself.

Some embodiments determine numerical delay models based on technology library 102 (operation 104). Examples of processes that can be used to determine numerical delay models are described in FIGS. 4 and 5 below. Specifically, output 106 of operation 104 can include a set of library cells and a specific numerical delay model for each library cell in the set of library cells and a generic numerical delay model for each library cell type. The set of library cells in output 106 typically includes all library cells in technology library 102, but in some embodiments certain library cells may be removed if desired.

Certain library cells can then be excluded (operation 108) to obtain a subset of library cells. Example of a process that can be used to exclude library cells is described in FIGS. 6A and 6B below. Each library cell in the subset of library cells has a specific numerical delay model that was computed in operation 104. In some embodiments, a new generic numerical delay model can be determined for each cell type based on the specific numerical delay models corresponding to the subset of library cells. These generic numerical delay models are "new" because they are based on the subset of library cells as opposed to being based on the set of library cells that were used in operation 104 to determine the generic numerical delay models. Output 110, i.e., the subset of library cells with their specific numerical delay models and optionally the new generic numerical delay models for the library cell types, can then be provided as input to the first phase of numerical synthesis 112.

The first phase of numerical synthesis 112 sizes cells in circuit design 114 using the subset of library cells with their specific numerical delay models and the new generic numerical delay models. In some embodiments, the first phase of numerical synthesis 112 models a numerical optimization problem based on circuit design 114 and the specific and generic numerical models for the subset of library cells. The cost function of the numerical optimization problem optimizes the delay of the circuit design. Output 116 from the first phase of numerical synthesis 112 includes the numerically optimized size for each cell instance in circuit design 114. Specifically, in some embodiments, output 116 includes the numerically optimized (and desired) input capacitance value for each cell instance in the circuit design 114.

Output 116 is then provided as one of the inputs to the second phase of numerical synthesis 118. The other input to second phase of numerical synthesis 118 is output 106 which includes the set of library cells that were generated by operation 104. The second phase of the numerical synthesis 118 then instantiates cells that have the numerically optimized and desired cell sizes in circuit design 114 to produce optimized circuit implementation 120 using the discrete library cells from the technology library. In particular, for each cell instance in circuit design 114, the second phase of numerical synthesis 118 selects a library cell that best matches the numerically optimized size, (if a library cell with exactly the optimized size is not available, a library cell with nearly the optimized size is selected) from the set of library cells that were part of output 106.

The reason a subset of library cells is used in the first phase and the set of library cells is used in the second phase is as follows. The first phase determines numerically optimized cell sizes by solving a numerical optimization problem. In this phase, it is desirable to restrict the search space to library cells that can be accurately modeled using a logical effort and parasitic delay based numerical modeling approach. Therefore, a subset of library cells is used in this phase to restrict the search space. Once the numerically optimized cell sizes have been determined, it is important to enable the circuit synthesis process to select cell instances from a wide range of library cells. Therefore, in the second phase, the restriction on the search space is relaxed and the set of library cells that was in output 106 is used.

Figure 2:
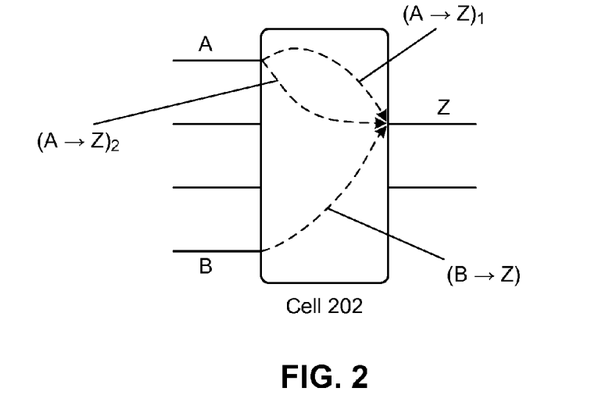
FIG. 2 illustrates a library cell in accordance with some embodiments described herein.

FIG. 2 illustrates a library cell in accordance with some embodiments described herein.

Library cell 202 has a set of inputs and a set of outputs. A signal path within library cell 202 from an input to an output is called a timing arc. One or more timing arcs may exist between an input and an output of a library cell. For example, two timing arcs exist between input A and output Z, which are shown as $(A \rightarrow Z)_1$ and $(A \rightarrow Z)_2$ in the figure. Only one timing arc exists between input B and output Z which is shown as $(B \rightarrow Z)$ in the figure. The delay behavior for each timing arc can be different. Furthermore, for a given timing arc, the delay behavior for a rising output transition can be different from the delay behavior for a falling output transition. In complex library cells like multiplexors, the difference in the delay characteristics for different timing arcs and for rising/falling output transitions can be significant.

The term "non-linear delay model," or "NLDM" for short, is used in this disclosure to refer to a discretized delay model that models cell delay. A discretized delay model is a model in which the delay behavior is represented using a set of discrete data points of delay behavior. Specifically, a discretized delay model, e.g., an NLDM, can be viewed as a set of points in a multi-dimensional space that includes an output loading dimension, an input transition (i.e., slew) dimension, an output delay dimension, and an output transition dimension.

In some embodiments, separate discretized delay models exist for one or more of: rise-rise, rise-fall, fall-rise, and fall-fall transitions. The term "rise-rise transition" refers to the situation when the input is a rising transition and the output is also a rising transition. The other terms have similar definitions. In some implementations, two or more NLDMs exist for each timing arc of each library cell, wherein each NLDM models the delay for a rise-rise, a rise-fall, a fall-rise, or a fall-fall transition.

Figure 3A:
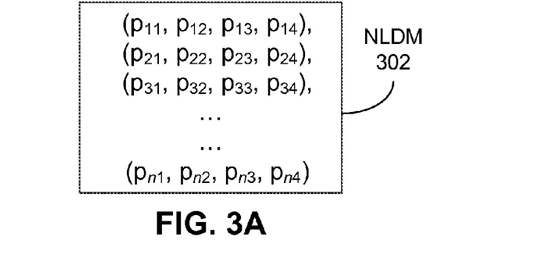
FIG. 3A illustrates how a non-linear delay model (NLDM) can be viewed as a set of points in a four dimensional space (two dimensions correspond to the inputs of the NLDM, and two dimensions correspond to the outputs of the NLDM) in accordance with some embodiments described herein.

FIG. 3A illustrates how an NLDM can be viewed as a set of points in a four dimensional space in accordance with some embodiments described herein. NLDM 302 has n points, each represented as a tuple of four elements. The elements in the tuple represent the values in the four dimensions. For example, $p_{11}$ can be a particular output loading value, $p_{12}$ can be a particular input transition value, $p_{13}$ can be a particular output delay value, and $p_{14}$ can be a particular output transition value. This point can represent one data point in the library cell's delay behavior: if the output load on an output "OUT" of a library cell is equal to $p_{11}$ and the library cell receives an input signal on an input "IN" with an input transition $p_{12}$, then the library cell produces an output signal on output "OUT" after a delay $p_{13}$ with an output transition $p_{14}$.

Figure 3B:
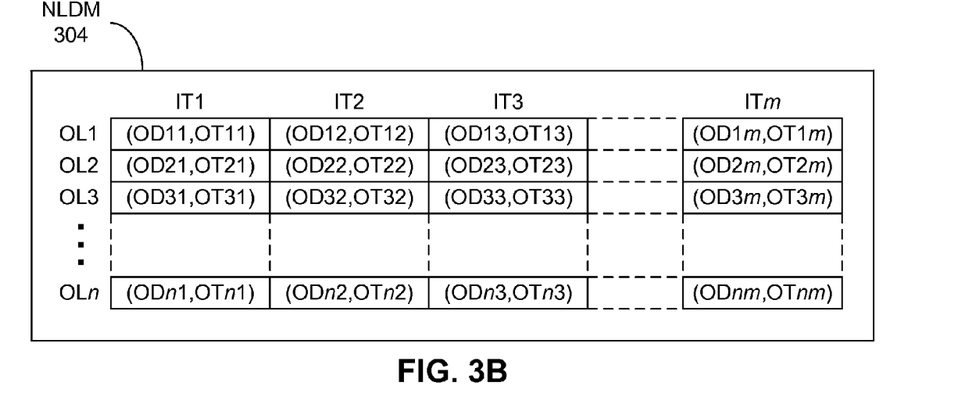
FIG. 3B illustrates how an NLDM can be viewed as a two dimensional table in accordance with some embodiments described herein.

FIG. 3B illustrates how an NLDM can be viewed as a two dimensional table in accordance with some embodiments described herein.

NLDM 304 can be represented as a two dimensional table, wherein each element in the table is a tuple of two values. Each row in the table corresponds to a particular output loading value: OL1, OL2, ..., OLn. Each column in the table corresponds to a particular input transition value: IT1, IT2, ..., ITm. Each element in the table is a tuple of the output delay value and the output transition value. For example, the tuple (OD32, OT32) is a tuple of the output delay value OD32 and the output transition value OT32 that corresponds to the output loading value OL3 and input transition value IT2.

The two dimensional table shown in FIG. 3B can be used to look up the output delay and output transition value for a given output loading and input transition value. Note that each element in the two dimensional table corresponds to a point in a four dimensional space. For example, the element (OD32, OT32) corresponds to the point (OL3, IT2, OD32, OT32). In the embodiment illustrated in FIG. 3B, the output loading dimension and the input transition dimension are the input dimensions of the table, and the output delay and output transition dimensions are the output dimensions of the table.

Since the NLDM is a discretized delay model, it can be made arbitrarily accurate by increasing the number of points in the model that are used to represent the delay behavior. Many existing technology libraries provide accurate NLDMs for all timing arcs of all the library cells.

Some embodiments described herein create a specific numerical delay model from a discretized delay model (e.g., an NLDM in a technology library). Some embodiments described herein determine a linear delay model from an NLDM. Specifically, some embodiments determine a logical effort value and a parasitic delay value from an NLDM. The electrical effort value in the linear delay model for a timing arc of a library cell is computed using the input capacitance value of the timing arc as specified in the technology library and the instance-specific output loading as seen by the timing arc's instance in the circuit design which instantiates the library cell.

The specific numerical delay model that is computed from the NLDM models the same delay behavior as the NLDM. For example, if the NLDM models the delay for a rising output transition for a particular timing arc of a library cell, then the specific numerical delay model that is determined from the NLDM will also model the delay for a rising output transition for that particular timing arc of the library cell. NLDMs also account for various input transitions.

A numerical delay model can model the delay at different levels of aggregation. For example, the numerical delay model can model (1) the rise delay and fall delay separately for a timing arc of a library cell, (2) the delay (e.g., the worst or average of the rise delay and fall delay) for a timing arc of a library cell, (3) the delay for a timing arc of a library cell type, or (4) the delay for all timing arcs of a library cell type. The term "rise delay" and "fall delay" refer to the delay of a timing arc of a library cell that correspond to a rising and falling output transition, respectively. In some embodiments, the term "rise delay" refers to the greater of the rise-rise and fall-rise delays; and the term "fall delay" refers to the greater of the rise-fall and fall-fall delays.

Some embodiments described herein determine aggregate numerical delay models based on individual numerical delay models. For example, suppose specific numerical delay model M1 models the rise delay for a particular timing arc of a library cell, and specific numerical delay model M2 models the fall delay for the same timing arc of the library cell. Some embodiments can create an aggregate numerical delay model M3 based on M1 and M2. Aggregate numerical delay model M3 can then be used to model both rise and fall delays. Note that M3 may not model the delays as accurately as M1 and M2. However, in some cases, it may be advantageous to use an aggregate numerical delay model even if it is not as accurate as the individual numerical delay models. Individual numerical delay models can be aggregated in many ways. The examples for aggregating numerical delay models provided in this disclosure are for illustration purposes only, and are not intended to limit the embodiments to the forms disclosed.

Figure 4:
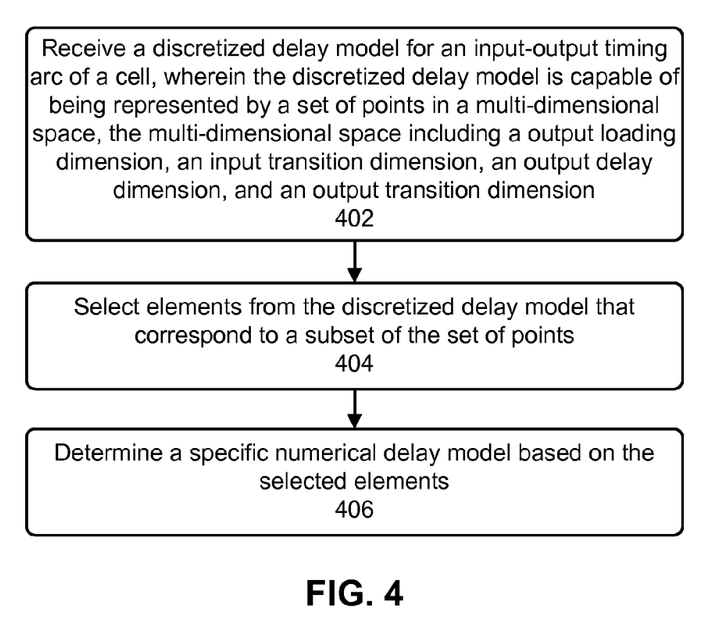
FIG. 4 illustrates a process for determining a specific numerical delay model from a discretized delay model in accordance with some embodiments described herein.

FIG. 4 illustrates a process for determining a specific numerical delay model from a discretized delay model in accordance with some embodiments described herein.

The process begins with receiving a discretized delay model for a timing arc of a library cell, wherein the discretized delay model is capable of being represented by a set of points in a multi-dimensional space, the multi-dimensional space including an output loading dimension, an input transition dimension, an output delay dimension, and an output transition dimension (operation 402). The discretized delay model may model the rise or fall delays.

Next, some embodiments select elements in the discretized model that correspond to a subset of the set of points (operation 404). In some embodiments described herein, sample points are selected for output loading and input transition times from the range of output loading and input transition times specified in the NLDM. The number and/or distribution of sample points that are selected can be programmable (e.g., the user may specify the number and/or the distribution in a configuration file).

In some embodiments, the range of output loading is limited using a programmable multiplier, q, as follows. Let $C_i$ be the input capacitance of the timing arc that is being analyzed. If $q \cdot C_i$ is within the output load range specified in the NLDM, then $q \cdot C_i$ is used as the upper bound of the output loading. On the other hand, if $q \cdot C_i$ is greater than the output load range specified in the NLDM, then the range specified in the NLDM is used.

Although the NLDM specifies a wide range of output loading, most library cells (when instantiated in a circuit design) have an operating range of output loading that is typically in the lower half of the output loading range. Therefore, in some embodiments described herein, a programmable parameter, u, between 0% and 100% is used to cluster the output loading sample points, such that a first fraction (e.g., half) of the sample points are clustered around the lower u % of the output loading range. This technique helps bias the numerical models that are derived in the process towards the typical operating range of output loading.

Similarly, although the NLDM specifies a wide range of input transitions, most library cells (when instantiated in a circuit design) have an operating range of input transitions that is typically in the lower half of the input transition range. Therefore, in some embodiments described herein, a programmable parameter, v, between 0% and 100% is used to cluster the input transition sample points, such that a second fraction (e.g., half) of the sample points are clustered around the lower v % of the input transition range.

In other words, in some embodiments described herein, the subset of the set of points is selected so that: (1) at least a first fraction (e.g., half) of the subset of the set of points have values in the output loading dimension that are less than a first threshold (e.g., within the lower u % of the output loading range), and (2) at least a second fraction (e.g., half) of the subset of the set of points have values in the input transition dimension that are less than a second threshold (e.g., within the lower v % of the input transition range).

A specific numerical delay model is then determined based on the selected elements (operation 406).

In some embodiments described herein, the specific numerical delay model is a linear delay model, and a specific logical effort value and a specific parasitic delay value for the timing arc of the library cell is determined based on the subset of the set of points.

The technology library includes the input capacitance for each input of the library cell. The electrical effort value is determined by dividing the instance-specific output capacitance (as seen by the timing arc when instantiated in a circuit design) by the input capacitance for the timing arc of the library cell for which the specific numerical model is being determined. The numerical model essentially determines the logical effort and the parasitic delay parameters. These two parameters as well as the instance-specific output load of the timing arc are used to determine its numerical delay.

In some embodiments, a linear delay model can be computed as follows. Let there be r sample points of output loading and s sample points of input transition time. In other words, let the subset of the set of points be such that there are r distinct output loading values and s distinct input transition time values. For example, the points corresponding to r rows and s columns in the table shown in FIG. 3B can be selected as the subset of the set of points.

Next, for each of the s input transition sample points, the output delay can be plotted as a function of the r output loading sample points. For example, in FIG. 3B, suppose three rows (i.e., r=3) corresponding to output loading values OL2, OL3, and OLn are selected, and two columns (i.e., s=2) corresponding to input transition values IT1 and IT3 are selected. Next, a plot for input transition value IT1 can be created as follows: the output delay values OD21, OD31, and ODn1 can be plotted against output loading values OL2, OL3, and OLn. A plot can similarly be created for input transition value IT3.

For each of the s plots, a linear fit can be determined. In some embodiments, a least-square-fit approach can be used to determine the linear fit. In some embodiments, the load points are biased towards the lower end of the load range, because this is often representative of the typical operating region of the gate. This operation results in s linear relationships for delay as a function of output load, one linear relationship for each of the s input transition sample points. Each linear relationship is of the following form:

$$d_i = m_i \cdot C_o + p_i, i \in s, \quad (4)$$

where $d_i$ is the output delay, $C_o$ is the output loading, $m_i$ is the slope of the linear fit, and $p_i$ is the intercept of the linear fit.

Equation (4) can be rewritten as follows:

$$d_i = (m_i \cdot C_i) \cdot \left(\frac{C_o}{C_i}\right) + p_i, i \in s, \quad (5)$$

where $C_i$ is the input capacitance of the library cell that is being considered (the value of $C_i$ is obtained from the technology library). Note that the above plots are created for a single timing arc, so the $C_i$ value that is used in Equation (5) is that of the input pin of the library cell corresponding to this timing arc.

Therefore, for $i^{th}$ input transition value, the logical effort for the timing arc of the library cell is equal to $(m_i \cdot C_i)$ and the parasitic delay for the timing arc of the library cell is equal to $p_i$. In this manner, for each of the s input transition values that were selected, a logical effort value and a parasitic delay value can be computed for each timing arc based on the NLDM.

The $(m_i \cdot C_i)$ and $p_i$ values may be different for different i∈s. The following approach can be used to determine a single logical effort value and a single parasitic delay value. First, a subset of the $m_i$ and $p_i$ values that are within a predetermined range can be selected. For example, a programmable value, a, between 0.0 and 1.0, can be received (e.g., from a configuration file). If $m_0$ and $p_0$ are the lowest $m_i$ and $p_i$ values, respectively, then the $m_i$ and $p_i$ values that are in the ranges [$m_0$, $m_0 \cdot (1+a)$] and [$p_0, p_0 \cdot (1+a)$], respectively, can be selected. In some embodiments, different ranges (e.g., different values of a) can be used for selecting the $m_i$ and $p_i$ values.

Once the subsets of $m_i$ and $p_i$ values have been selected, the selected values can be averaged to obtain the specific logical effort value, $g_s$, and the specific parasitic delay value, $p_s$, for the timing arc of the library cell. The terms "specific logical effort value" and "specific parasitic delay values" refer to the logical effort value and the parasitic effort value, respectively, for either the rise delay or fall delay for a timing arc of a library cell.

In other words, the specific logical effort value and the specific parasitic delay value can be determined by (1) determining a set of logical effort values and a set of parasitic delay values, wherein determining each logical effort value and parasitic delay value involves determining a linear fit between output loading and output delay for a given input transition value, and (2) determining the specific logical effort value and the specific parasitic delay value based on the set of logical effort values and the set of parasitic delay values, respectively. Some embodiments select a subset of logical effort values and a subset of parasitic delay values (e.g., selecting $m_i$ and $p_i$ values that are within a predetermined range), and then determine the specific logical effort value and the specific parasitic delay value based on the subset of logical effort values and the subset of parasitic delay values, respectively, for each timing arc of the library cell.

The linear rise or fall delay model of a timing arc of a library cell can be expressed as:

$$d_s = g_s \cdot h_s + p_s, \quad (6)$$

where, $d_s$ is the output delay, $g_s$ is the specific logical effort, $$h_s = \left(\frac{C_o}{C_i}\right)$$

is the electrical effort, and $p_s$ is the specific parasitic delay.

Once the specific logical effort values and the specific parasitic delay values are determined, they can then be aggregated in many ways. In some embodiments, the $g_s$ and $p_s$ values for the rise delay and the $g_s$ and $p_s$ values for the fall delay can be averaged to obtain $g_s$ and $p_s$ values that are aggregated across rise and fall delays. These aggregated values can be used to model rise and fall delays. That is, when such aggregation is done, we don't distinguish between rise and fall delays when using the specific numerical delay model.

In some embodiments described herein, the specific logical effort values and the specific parasitic delay values can be aggregated at the library cell type level to obtain a generic logical effort value and a generic parasitic delay value for the library cell type. In some embodiments, the specific logical effort values and the specific parasitic delay values are aggregated across the timing arcs of a particular library cell to obtain specific logical effort values and specific parasitic delay values for the library cell. This aggregation can be performed in operation 406 in FIG. 4.

Figure 5:
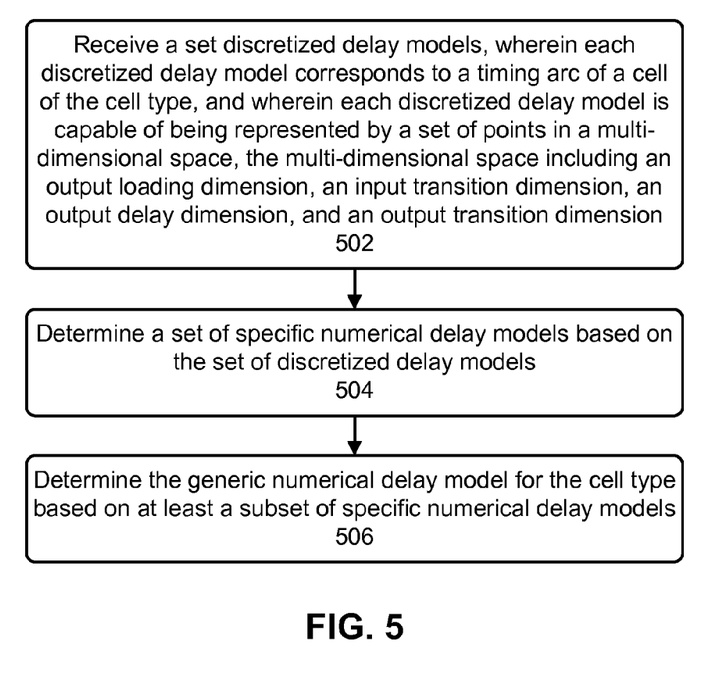
FIG. 5 illustrates a process for determining a generic numerical delay model for a library cell type in accordance with some embodiments described herein.

FIG. 5 illustrates a process for determining a generic numerical delay model for a library cell type in accordance with some embodiments described herein.

The process begins by receiving a set of discretized delay models, wherein each discretized delay model corresponds to a timing arc of a library cell of the library cell type, and wherein each discretized delay model is capable of being represented by a set of points in a multi-dimensional space, the multi-dimensional space including an output loading dimension, an input transition dimension, an output delay dimension, and an output transition dimension (operation 502).

Next, a set of specific numerical delay models based on the set of discretized delay models is determined (operation 504). For example, the process shown in FIG. 4 can be used to determine a specific numerical delay model for each discretized delay model in the set of delay models. This process determines the specific logical effort and specific parasitic delay values for each timing arc of each library cell.

Next, the embodiments determine the generic numerical delay model for the library cell type based on at least a subset of specific numerical delay models (operation 506).

In some embodiments described herein, the generic numerical delay model for a timing arc of the library cell type is determined by aggregating the specific logical effort and specific parasitic delay values for the timing arc. In some embodiments described herein, each specific numerical delay model for a timing arc of a library cell is defined using a specific logical effort value, a specific parasitic delay value, and an electrical effort value.

To determine a generic numerical delay model for a library cell type, some embodiments use the following approach: (1) determine a set of specific logical effort values and a set of specific parasitic delay values for all timing arcs of all library cells, (2) determine a generic logical effort value and a generic parasitic delay value for each timing arc of the library cell type based on the corresponding specific logical effort values and specific parasitic delay values, respectively (this may involve selecting subsets of logical effort values and parasitic delay values, and then using the subsets to determine the generic logical effort value and the generic parasitic delay value), and (3) determine a logical effort value and parasitic delay value for the library cell type based on the generic logical effort values and generic parasitic delay values for the different timing arcs of the library cell type.

For a particular set of $g_s$ values (e.g., the set of specific logical effort values for a timing arc for a set of library cells of a library cell type), some embodiments can use the following approach to determine a generic logical effort value for that timing arc of a library cell type. First, an embodiment can derive the mean, $\mu$, and a standard deviation, $\sigma$, of the set of $g_s$ values. Next, the embodiment can select a subset of the set of $g_s$ values that contain values that are within a given range of the mean $\mu$. For example, the embodiment can select values that are within one standard deviation of the mean. This would include the $g_s$ values that satisfy the following inequality: $(\mu-\sigma) \leq g_s \leq (\mu+\sigma)$. Let the subset of $g_s$ values be called S. Using the $g_s$ values in S, the embodiment can compute the mean, $\mu_S$. The mean $\mu_S$ can be used as the generic logical effort, g, of the timing arc of the library cell type.

If the rise and fall $g_s$ values were computed separately (e.g., because there were separate discretized models for rise and fall delays), then the embodiment can compute the generic rise logical effort value, $g_r$, and the generic fall logical effort, $g_f$. Next, the embodiment can compute the generic logical effort value for the timing arc of the library cell type by computing an average of the rise and fall logical effort values. In some embodiments, the generic logical effort value for the timing arc of the library cell type can be assigned to be equal to the worst (in this case, the term "worst" corresponds to the maximum value) of $g_r$ and $g_f$ instead of the average of $g_r$ and $g_f$.

A similar approach can be used to determine a generic parasitic delay value for a timing arc of a library cell type based on the specific parasitic delay values. These examples of how a generic logical effort value and a generic parasitic delay value can be computed for a timing arc of a library cell type have been provided for illustration purposes only and are not intended to limit the embodiments to the forms disclosed. Many variations and modifications to the disclosed aggregation techniques will be apparent to those skilled in the art.

Once the generic logical effort value and the generic parasitic delay value has been computed for each timing arc of a library cell type, a logical effort value and a parasitic delay value for the library cell type can be computed. In some embodiments, the generic logical effort value for each timing arc can be averaged (e.g., by assigning the same or different weights to the timing arcs) to obtain a logical effort value for the library cell type. In other embodiments, the logical effort value for the library cell type can be assigned to be the worst (i.e., the maximum in this case) generic logical effort value across all of the timing arcs of the library cell type. A parasitic delay value for the library cell type can be obtained using a similar approach.

Once the one or more specific and/or generic numerical delay models for the library cells and/or library cell types have been computed, they can be used for timing analysis in a circuit synthesis approach to create circuit implementations. Using these numerical delay models in circuit synthesis is expected to result in circuit implementations that do not contain any timing violations or that contain very few timing violations. This is because these numerical delay models are computed from accurate discrete delay models, and because the above-described approaches for creating the numerical delay models select discrete data points in an operating region where the delay behavior is approximately linear.

During the first phase of numerical synthesis (e.g., operation 112), it may be desirable to exclude library cells that do not adhere to the assumptions made in the numerical delay models that are used in this phase. One approach for excluding library cells is now described.

Let S be the set of library cells of a particular library cell type in the technology library. For a programmable value, t, between 0.0 and 1.0, and using the generic logical effort, g, and the generic parasitic delay, p, of a library cell type timing arc, we determine sets of library cells, $S_g$ and $S_p$, that are subsets of S, such that: (1) the specific logical effort value of each library cell in $S_g$ is greater than (1+t) times g, and (2) the specific parasitic delay value of each library cell in $S_p$ is greater than (1+t) times p. The library cells in $S_g$ and $S_p$ can then be pruned from the first phase of the numerical synthesis process. Therefore, the subset of library cells corresponding to the timing arc that remains after the pruning operation is given by $\{S-S_g\} \cap \{S-S_p\}$.

The above-described process of excluding library cells is applied to all timing arcs of the library cell type. In other words, the subset of library cells of a given cell type that remain after the pruning process is given by:

$$T = \bigcap_i (\{S - S_g^i\} \cap \{S - S_p^i\}), \quad (7)$$

where i is a timing arc of the cell type, and $S_g^i$ and $S_p^i$ are the above-described subsets $S_g$ and $S_p$, respectively, corresponding to the timing arc i of the cell type.

In other words, all the library cells that belong to the set {S−T} are identified as cells that do not adhere to the assumptions of the numerical delay model. The excluded library cells are not used during the first phase (the delay optimization phase) of numerical synthesis, but they are used during the second phase (the phase in which cells having optimized cell sizes are instantiated into the circuit design).

The above exclusion process has been shown for illustration purposes only and is not intended to limit the embodiments disclosed herein. Many modifications and variations will be apparent to those skilled in the art.

For example, in some embodiments, different exclusion thresholds (i.e., "t" values) can be used for logical effort and parasitic delay values, and/or for different timing arcs.

In some embodiments, the exclusion process can be used separately for rise and fall logical effort values, and rise and fall parasitic delay values. In these embodiments, a library cell is excluded if the library cell does not adhere to the assumptions of the numerical delay model in any of the four analyses.

In some embodiments, the exclusion process can use only logical effort values (rise, fall, or combined) to exclude library cells, i.e., the process can exclude library cells based on the intersection of $S_g^i$ only. In other words, in this embodiment, the subset of library cells of a given cell type that remain after the pruning process is given by:

$$T = \bigcap_i \{S - S_g^i\}. \quad (8)$$

Once a subset of library cells, T, has been determined, some embodiments recompute a generic logical effort value and a generic parasitic delay value based on the specific numerical delay models associated with the subset of library cells, T. Note that the generic logical effort value and the generic parasitic delay value that is computed based on the library cells in T could be different from the generic logical effort value and the generic parasitic delay value that was computed based on the library cells in S.

Some embodiments perform this process of excluding library cells and recomputing the generic logical effort value and the generic parasitic delay value iteratively. In particular, some embodiments perform the following two operations iteratively: (1) determine a subset of library cells by excluding library cells whose specific logical effort values and the specific parasitic delay values are greater than (1+t) times the current generic logical effort value and the generic parasitic delay value, respectively, and (2) recompute a generic logical effort value and a generic parasitic delay value based on the subset of library cells. The iterative process can be terminated once the subset of library cells converges, e.g., once the number of cells that are excluded is less than a predetermined threshold. In practice, this process typically converges within 2-3 iterations.

Figure 6A:
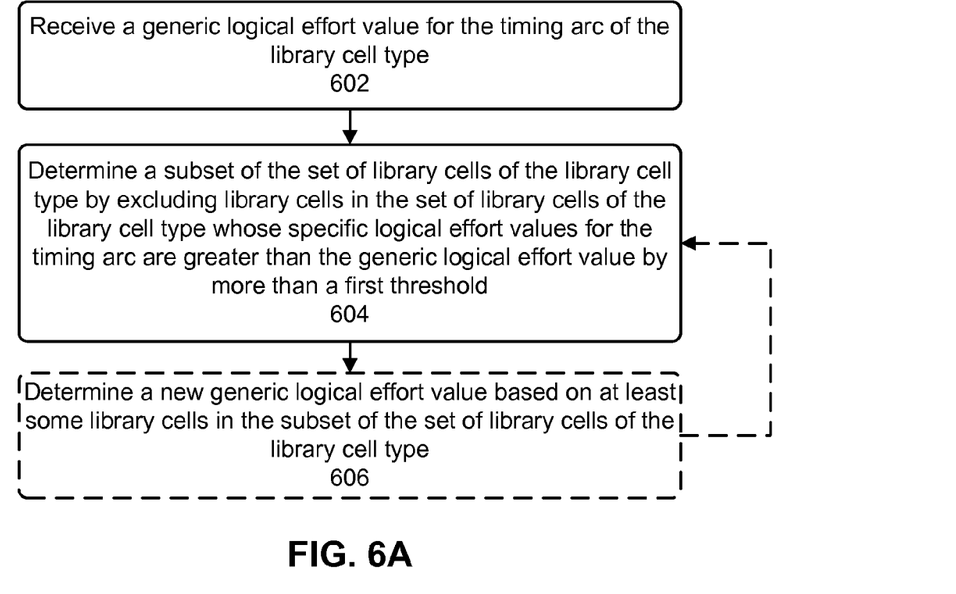
FIG. 6A illustrates a process for excluding library cells in accordance with some embodiments described herein.

FIG. 6A illustrates a process for excluding library cells in accordance with some embodiments described herein.

The process begins by receiving a generic logical effort value for the timing arc of the library cell type (operation 602). Next, a subset of the set of library cells of the library cell type is determined by excluding library cells in the set of library cells of the library cell type whose specific logical effort values for the timing arc are greater than the generic logical effort value by more than a first threshold (operation 604). For example, the first threshold can be equal to g·t, where g is the generic logical effort value, and t is a predetermined value between 0 and 1, and operation 604 can exclude all library cells whose specific logical effort value is greater than g·(1+t).

In some embodiments, a new generic logical effort value can be determined based on at least some library cells in the subset of the set of library cells of the library cell type (operation 606). Operation 606 is optional. Additionally, in some embodiments, operations 606 and 604 can be performed iteratively until a termination condition is satisfied. This iterative process is also optional and is illustrated in FIG. 6A using a dashed arrow from operation 606 to 604.

Figure 6B:
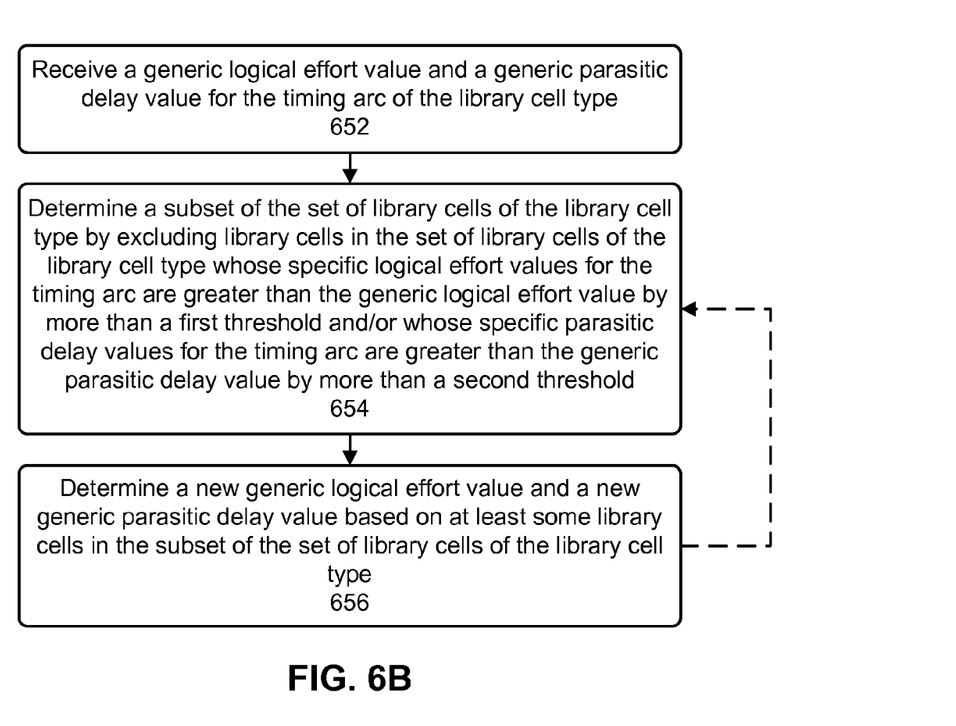
FIG. 6B illustrates another process for excluding library cells in accordance with some embodiments described herein.

FIG. 6B illustrates another process for excluding library cells in accordance with some embodiments described herein.

The process begins by receiving a generic logical effort value and a generic parasitic delay value for the timing arc of the library cell type (operation 652). Next, a subset of the set of library cells of the library cell type is determined by excluding library cells in the set of library cells of the library cell type whose specific logical effort values for the timing arc are greater than the generic logical effort value by more than a first threshold and/or whose specific parasitic delay values for the timing arc are greater than the generic parasitic delay value by more than a second threshold (operation 654). The first threshold may or may not be the same as the second threshold. For example, the first threshold can be equal to g·t, the second threshold can be equal to p·t, where g is the generic logical effort value, p is the generic parasitic delay value, and t is a predetermined value between 0 and 1. In this example, operation 654 can exclude all library cells whose specific logical effort value is greater than g·(1+t) and/or whose specific parasitic delay value is greater than p·(1+t).

In some embodiments, a new generic logical effort value and a new generic parasitic delay value can be determined based on at least some library cells in the subset of the set of library cells of the library cell type (operation 656). Additionally, in some embodiments, operations 656 and 654 can be performed iteratively until a termination condition is satisfied. This iterative process is optional and is illustrated in FIG. 6B using a dashed arrow from operation 656 to 654.

Figure 7:
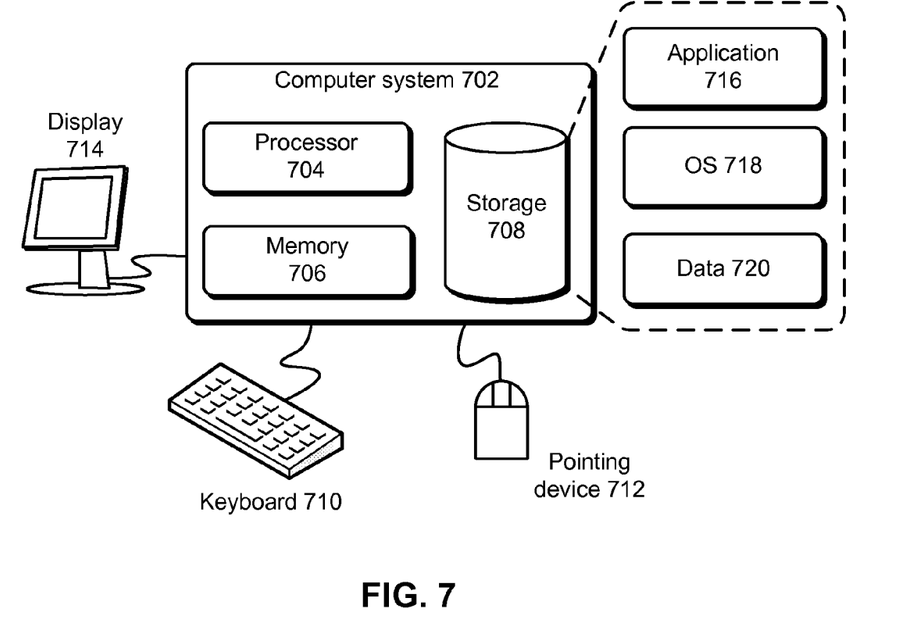
FIG. 7 illustrates a computer system in accordance with an embodiment of the present invention.

FIG. 7 illustrates a computer system in accordance with an embodiment of the present invention.

A computer system can generally be any hardware-based system that can perform computations. Specifically, a computer system can be a microprocessor, an application specific integrated circuit, a distributed computing system, a cloud computing system, or any other computing system now known or later developed. Computer system 702 shows one example of a computer system. Computer system 702 comprises processor 704, memory 706, and storage 708. Computer system 702 can be coupled with display 714, keyboard 710, and pointing device 712. Storage 708 can generally be any device that can store data. Specifically, a storage device can be a magnetic, an optical, or a magneto-optical storage device, or it can be based on flash memory and/or battery-backed up memory. Storage 708 can store application 716, operating system 718, and data 720.

Application 716 can include instructions that when executed by computer 702 cause computer 702 to perform one or more processes that are implicitly or explicitly described in this disclosure. Data 720 can include any data that is inputted into or outputted by application 716.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a subset of a set of library cells of a library cell type for a timing arc of the library cell type, the method comprising:
   receiving a first generic logical effort value for the timing arc of the library cell type, wherein the first generic logical effort value is determined by aggregating specific logical effort values across multiple library cells of the library cell type receiving a generic parasitic delay value for the timing arc of the library cell type; and
   determining, by using a computer, the subset of the set of library cells of the library cell type, wherein said determining comprises:
   excluding library cells in the set of library cells of the library cell type whose specific logical effort values for the timing arc are greater than the first generic logical effort value by more than a first threshold, and
   excluding library cells in the set of library cells of the library cell type whose specific parasitic delay values for the timing arc are greater than the generic parasitic delay value by more than a second threshold.

2. The method of claim 1, wherein the method further comprises iteratively performing said excluding by:
   determining a second generic logical effort value based on at least some library cells in the subset of the set of library cells of the library cell type; and
   excluding library cells in the subset of the set of library cells of the library cell type whose specific logical effort values for the timing arc are greater than the second generic logical effort value by more than a second threshold.

3. The method of claim 1, wherein the first threshold is equal to the second threshold.

4. The method of claim 1, wherein the generic logical effort value and the generic parasitic delay value model a rise delay, a fall delay, or both a rise and fall delay for the timing arc.

5. The method of claim 1, wherein the method further comprises iteratively performing said excluding by:
   determining a third generic logical effort value and a third generic parasitic delay value based on at least some library cells in the subset of the set of library cells of the library cell type; and
   excluding library cells in the subset of the set of library cells of the library cell type whose specific logical effort values for any of its timing arcs are greater than the third generic logical effort value by more than a third threshold, or whose specific parasitic delay values for any of its timing arcs are greater than the third generic parasitic delay value by more than a fourth threshold.

6. The method of claim 1, further comprising:
   performing a first phase of numerical synthesis using the subset of the set of library cells of the library cell type; and
   performing a second phase of numerical synthesis using the set of the library cells of the library cell type.

7. A non-transitory computer-readable storage medium storing instructions that, when executed by a computer, cause the computer to perform a method for determining a subset of a set of library cells of a library cell type for a timing arc of the library cell type, the method comprising:
   receiving a first generic logical effort value for the timing arc of the library cell type, wherein the first generic logical effort value is determined by aggregating specific logical effort values across multiple library cells of the library cell type receiving a generic parasitic delay value for the timing arc of the library cell type; and
   determining the subset of the set of library cells of the library cell type, wherein said determining comprises:
   excluding library cells in the set of library cells of the library cell type whose specific logical effort values for the timing arc are greater than the first generic logical effort value by more than a first threshold, and
   excluding library cells in the set of library cells of the library cell type whose specific parasitic delay values for the timing arc are greater than the generic parasitic delay value by more than a second threshold.

8. The non-transitory computer-readable storage medium of claim 7, wherein the method further comprises iteratively performing said excluding by:
   determining a second generic logical effort value based on at least some library cells in the subset of the set of library cells of the library cell type; and excluding library cells in the subset of the set of library cells of the library cell type whose specific logical effort values for the timing arc are greater than the second generic logical effort value by more than a second threshold.

9. The non-transitory computer-readable storage medium of claim 7, wherein the first threshold is equal to the second threshold.

10. The non-transitory computer-readable storage medium of claim 7, wherein the generic logical effort value and the generic parasitic delay value model a rise delay, a fall delay, or both a rise and fall delay for the timing arc.

11. The non-transitory computer-readable storage medium of claim 7, wherein the method further comprises iteratively performing said excluding by:
determining a third generic logical effort value and a third generic parasitic delay value based on at least some library cells in the subset of the set of library cells of the library cell type; and
excluding library cells in the subset of the set of library cells of the library cell type whose specific logical effort values for any of its timing arcs are greater than the third generic logical effort value by more than a third threshold, or whose specific parasitic delay values for any of its timing arcs are greater than the third generic parasitic delay value by more than a fourth threshold.

12. The non-transitory computer-readable storage medium of claim 7, wherein the method further comprises:
performing a first phase of numerical synthesis using the subset of the set of library cells of the library cell type; and
performing a second phase of numerical synthesis using the set of the library cells of the library cell type.

13. A system, comprising:
a processor; and
a storage medium storing instructions that, when executed by the processor, cause the system to perform a method for determining a subset of a set of library cells of a library cell type for a timing arc of the library cell type, the method comprising:
receiving a first generic logical effort value for the timing arc of the library cell type, wherein the first generic logical effort value is determined by aggregating specific logical effort values across multiple library cells of the library cell type receiving a generic parasitic delay value for the timing arc of the library cell type; and
determining the subset of the set of library cells of the library cell type, wherein said determining comprises:
excluding library cells in the set of library cells of the library cell type whose specific logical effort values for the timing arc are greater than the first generic logical effort value by more than a first threshold, and
excluding library cells in the set of library cells of the library cell type whose specific parasitic delay values for the timing arc are greater than the generic parasitic delay value by more than a second threshold.

14. The system of claim 13, wherein the method further comprises iteratively performing said excluding by:
determining a second generic logical effort value based on at least some library cells in the subset of the set of library cells of the library cell type; and
excluding library cells in the subset of the set of library cells of the library cell type whose specific logical effort values for the timing arc are greater than the second generic logical effort value by more than a second threshold.

15. The system of claim 13, wherein the first threshold is equal to the second threshold.

16. The system of claim 13, wherein the generic logical effort value and the generic parasitic delay value model a rise delay, a fall delay, or both a rise and fall delay for the timing arc.

17. The system of claim 13, wherein the method further comprises iteratively performing said excluding by:
determining a third generic logical effort value and a third generic parasitic delay value based on at least some library cells in the subset of the set of library cells of the library cell type; and
excluding library cells in the subset of the set of library cells of the library cell type whose specific logical effort values for any of its timing arcs are greater than the third generic logical effort value by more than a third threshold, or whose specific parasitic delay values for any of its timing arcs are greater than the third generic parasitic delay value by more than a fourth threshold.

18. The system of claim 13, wherein the method further comprises:
performing a first phase of numerical synthesis using the subset of the set of library cells of the library cell type; and
performing a second phase of numerical synthesis using the set of the library cells of the library cell type.

* * * * *